United States Patent
Andrews

(10) Patent No.: US 9,515,229 B2
(45) Date of Patent: Dec. 6, 2016

(54) SEMICONDUCTOR LIGHT EMITTING DEVICES WITH OPTICAL COATINGS AND METHODS OF MAKING SAME

(75) Inventor: Peter S. Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 884 days.

(21) Appl. No.: 12/887,067

(22) Filed: Sep. 21, 2010

(65) Prior Publication Data

US 2012/0068209 A1 Mar. 22, 2012

(51) Int. Cl.
*H01L 21/00* (2006.01)
*H01L 33/50* (2010.01)

(52) U.S. Cl.
CPC ....... *H01L 33/50* (2013.01); *H01L 2933/0041* (2013.01)

(58) Field of Classification Search
CPC ....................................................... H01L 33/50
USPC ............................................. 438/22; 257/98
See application file for complete search history.

(56) References Cited

U.S. PATENT DOCUMENTS

| | | |
|---|---|---|
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,631,190 A | 5/1997 | Negley |
| 5,739,554 A | 4/1998 | Edmond et al. |
| 5,912,477 A | 6/1999 | Negley |
| 6,120,600 A | 9/2000 | Edmond et al. |
| 6,187,606 B1 | 2/2001 | Edmond et al. |
| 6,201,262 B1 | 3/2001 | Edmond et al. |
| 6,650,044 B1 | 11/2003 | Lowery |
| 6,917,057 B2 | 7/2005 | Stokes et al. |
| 7,314,770 B2 | 1/2008 | Boardman et al. |
| 7,549,905 B2 | 6/2009 | Lee et al. |
| 2002/0123164 A1 | 9/2002 | Slater, Jr. et al. |
| 2002/0167262 A1* | 11/2002 | Porter et al. .................. 313/483 |
| 2003/0006418 A1 | 1/2003 | Emerson et al. |
| 2004/0056260 A1 | 3/2004 | Slater, Jr. et al. |
| 2005/0062140 A1* | 3/2005 | Leung et al. ................. 257/678 |

(Continued)

OTHER PUBLICATIONS

"When Teflon Becomes the Adhesive", 2007 [retrieved from the internet Dec. 24, 2011] http://www.omnexus4adhesives.com/services/editorials.aspx?id=912.

(Continued)

*Primary Examiner* — Ajay K Arora
(74) *Attorney, Agent, or Firm* — Myers Bigel P.A.

(57) ABSTRACT

A method of making a semiconductor light emitting device having one or more light emitting surfaces includes positioning a stencil on a substrate such that a chip disposed on the substrate is positioned within an opening in the stencil. Phosphor-containing material is deposited in the opening to form a coating on one or more light emitting surfaces of the chip. The opening may or may not substantially conform to a shape of the chip. The phosphor-containing material is cured with the stencil still in place. After curing, the stencil is removed from the substrate and the coated chip is separated from the substrate. The chip may then be subjected to further processing.

5 Claims, 7 Drawing Sheets

(56) References Cited

U.S. PATENT DOCUMENTS

| | | |
|---|---|---|
| 2007/0297179 A1* | 12/2007 | Leung et al. .............. 362/296 |
| 2008/0048200 A1 | 2/2008 | Mueller et al. |
| 2008/0054279 A1 | 3/2008 | Hussell et al. |
| 2008/0076316 A1* | 3/2008 | Negley ...................... 445/23 |
| 2009/0153022 A1 | 6/2009 | Hussell et al. |
| 2009/0212308 A1 | 8/2009 | Brunner et al. |
| 2010/0155763 A1 | 6/2010 | Donofrio et al. |
| 2010/0181582 A1 | 7/2010 | Li et al. |

OTHER PUBLICATIONS

International Search Report Corresponding to International Application No. PCT/US2011/052120; Date of Mailing: Jan. 18, 2012; 13 pages.
Table B.6 Room—Temperature Linear Coefficient of Thermal Expansion Values for Various Engineering Materials, 1989 [retrieved from the Internet Dec. 24, 2011] http://www.stormcable.com/uploads/Thermal_expansion_data_table_tb06.pdf.

* cited by examiner

SEMICONDUCTOR LIGHT EMITTING DEVICES WITH OPTICAL COATINGS AND METHODS OF MAKING SAME

FIELD OF THE INVENTION

This invention relates to lighting devices, and more particularly to semiconductor light emitting devices including wavelength conversion materials.

BACKGROUND

Light emitting diodes and laser diodes are well known solid state electronic devices capable of generating light upon application of a sufficient voltage. Light emitting diodes and laser diodes may be generally referred to as light emitting devices ("LEDs"). Light emitting devices generally include a p-n junction formed in an epitaxial layer grown on a substrate such as sapphire, silicon, silicon carbide, gallium arsenide and the like. The wavelength distribution of the light generated by the LED generally depends on the material from which the p-n junction is fabricated and the structure of the thin epitaxial layers that make up the active region of the device.

Typically, an LED chip includes a substrate, an n-type epitaxial region formed on the substrate and a p-type epitaxial region formed on the n-type epitaxial region (or vice-versa). In order to facilitate the application of a voltage to the device, an anode ohmic contact is formed on a p-type region of the device (typically, an exposed p-type epitaxial layer) and a cathode ohmic contact is formed on an n-type region of the device (such as the substrate or an exposed n-type epitaxial layer). In other embodiments, a substrate need not be included. Accordingly, the term "diode" or "chip" typically refers to the structure that minimally includes two semiconductor portions of opposite conductivity types (p and n) along with some form of ohmic contacts to permit current to be applied across the resulting p-n junction.

It is known to enclose an LED chip in a package that can perform a number of functions and provide a number of benefits. For example, an LED package can provide mechanical support and environmental protection for the chip, as well as providing electrical leads for connecting the chip to an external circuit, and heatsinks for efficient heat extraction from the chip. An LED package can also perform optical functions. For example, an LED package can include optical materials and/or structures, such as lenses, reflectors, light scattering layers, etc., that can direct light output by the semiconductor chip in a desired manner.

In a typical LED package 10 illustrated in FIG. 1, an LED chip 12 is mounted on a reflective cup 13 by means of a solder bond or conductive epoxy. One or more wirebonds 11 connect the ohmic contacts of the LED chip 12 to leads 15A and/or 15B, which may be attached to or integral with the reflective cup 13. The reflective cup 13 may be filled with an encapsulant material 16 containing a wavelength conversion material such as phosphor particles. The entire assembly may then be encapsulated in a clear protective resin 14, which may be molded in the shape of a lens to collimate the light emitted from the LED chip 12.

The color emitted by an LED is largely defined by the material from which it is formed. Chips formed of gallium arsenide (GaAs) and gallium phosphide (GaP) tend to emit photons in the lower energy (red and yellow) portions of the visible spectrum. Materials such as silicon carbide (SiC) and the Group III nitrides (e.g., AlGaN, InGaN, AlInGaN) have larger bandgaps and thus can generate photons with greater energy that appear in the green, blue and violet portions of the visible spectrum as well as in the ultraviolet portions of the electromagnetic spectrum.

It is often desirable to incorporate phosphor into an LED package to enhance the emitted radiation in a particular frequency band and/or to convert at least some of the radiation to another frequency band. In general, light is emitted by a phosphor when a photon having energy higher than a bandgap of the phosphor material passes through the phosphor and is absorbed. When the photon is absorbed, an electronic carrier in the phosphor is stimulated from a resting state to an excited state. When the electronic carrier decays back to a resting state, a photon can be emitted by the phosphor. However, the emitted photon may have an energy that is less than the energy of the absorbed photon. Thus, the emitted photon may have a wavelength that is longer than the absorbed photon.

The term "phosphor" is used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent and/or phosphorescent. In general, phosphor particles absorb light having shorter wavelengths and re-emit light having longer wavelengths. As such, some or all of the light emitted by the LED chip at a first wavelength may be absorbed by the phosphor particles, which may responsively emit light at a second wavelength. For example, a single blue emitting LED chip may be surrounded with a yellow phosphor, such as cerium-doped yttrium aluminum garnet (YAG). The resulting light, which is a combination of blue light and yellow light, may appear white to an observer.

Methods of applying phosphor to an LED chip include conformal coating methods and mini-glob methods. Conformal coatings are traditionally applied by dipping, spraying or simple flow coating. However, conformal coating methods may waste phosphor as the coating is typically not specific to a small target area. In mini-glob methods, a small amount of resin carrying a dispersed phosphor is applied to a specific location(s) of a surface of an LED chip. Although more efficient in the amount of phosphor used and the dCCT (Delta Color Coordinate Temperature, i.e., the range of color temperatures emitted from a device when viewed from full range of angles) obtained, conventional mini-glob methods may not be as conversion-efficient as conformal coating methods. As such, methods of applying phosphor that achieve both conversion efficiency and efficiency in the amount of phosphor used, as well as dCCT obtained, are desired.

SUMMARY

It should be appreciated that this Summary is provided to introduce a selection of concepts in a simplified form, the concepts being further described below in the Detailed Description. This Summary is not intended to identify key features or essential features of this disclosure, nor is it intended to limit the scope of the invention.

According to some embodiments of the present invention, a method of making a semiconductor light emitting device (i.e., an LED chip) having one or more light emitting surfaces includes positioning a stencil on a substrate such that a chip disposed on the substrate is positioned within an opening in the stencil. Phosphor-containing material (e.g., silicone) is deposited in the opening to form a coating on one or more light emitting surfaces of the chip. The one or more light emitting surfaces emit light having a first dominant wavelength upon the application of a voltage to the chip. The phosphor particles convert light emitted by the one or more light emitting surfaces to light having a second dominant wavelength different from the first dominant wavelength.

In some embodiments, the opening substantially conforms to a shape of the chip. As such, the phosphor-containing material forms a coating on the one or more light emitting surfaces that conforms to the shape of the chip. In other words, each coating layer above a respective light emitting surface has a respective surface that is substantially parallel with the underlying light emitting surface. In other embodiments, the opening does not substantially conform to a shape of the chip. As such, the phosphor-containing material forms a coating on the one or more light emitting surfaces with a shape different from that of the chip. In other words, one or more coating layer above a respective light emitting surface has a respective surface that is not substantially parallel with the underlying light emitting surface.

The phosphor-containing material is cured with the stencil still in place. Various curing methods may be utilized such as, for example, heat curing, optical curing, or room temperature curing. After curing, the stencil is removed from the substrate and the coated chip is separated from the substrate. The chip may then be subjected to further processing such as, for example, additional molding operations for forming a final lens shape.

In order to facilitate separation of the stencil from the chip without damaging the cured coating or the chip, a mold release material may be applied to the stencil prior to depositing the phosphor-containing material in the opening. In some embodiments, the stencil may be formed from or coated with a material that facilitates separation of the stencil from the chip. For example, the stencil may be formed of material having a coefficient of thermal expansion that is different from that of the cured phosphor-containing material. In some embodiments, the stencil may be formed from or coated with material having lower surface energy than that of the cured phosphor-containing material, such as polytetrafluoroethylene and parylene.

In order to maintain the stencil in proper registration with the light emitting element, the stencil may be secured to the substrate, for example, via an adhesive. In addition, the stencil and substrate may be sealed by a barrier material to prevent leakage of the phosphor-containing material between the stencil and substrate. In some embodiments, an adhesive may also serve as a barrier material.

In some embodiments, the phosphor particles in the material deposited within the opening are caused to become arranged in a densely packed layer at the one or more light emitting surfaces of the chip, prior to curing. The material is then cured to lock the densely packed layer in position at the one or more light emitting surfaces. Because the densely packed layer of phosphor particles is located at the one or more light emitting surfaces, coating material above the densely packed layer of phosphor particles is devoid of phosphor particles, and can be removed and/or reduced, if desired. Also, because the densely packed layer of phosphor particles is in contacting relationship with the one or more light emitting surfaces, heat transfer between the phosphor particles and the chip may be substantially improved over conventional LEDs. For example, an average distance that heat generated by the phosphor particles travels from the densely packed layer to the chip is substantially less than about half a thickness of the coating.

In some embodiments, causing the phosphor particles in the material to become arranged in a densely packed layer at the one or more light emitting surfaces includes subjecting the chip to centrifugal force. In some embodiments, causing the phosphor particles in the material to become arranged in a densely packed layer at the light emitting surface includes subjecting the phosphor-containing material to at least one harmonic vibration, for example, via a vibration table.

In other embodiments, causing the phosphor particles to become arranged in a densely packed layer at the one or more light emitting surfaces includes heating the material to a predetermined temperature for a predetermined time to lower the viscosity of the material such that the phosphor particles can settle under the force of gravity. In some embodiments, the material may be directly heated. In some embodiments, the material may be directly heated and/or indirectly heated via the chip. In other embodiments, causing the phosphor particles to become arranged in a densely packed layer at the one or more light emitting surfaces includes applying a solvent, such as hexane or xylene, to the deposited phosphor-containing material prior to curing the material.

In other embodiments, the viscosity of the phosphor-containing material can be lowered via the addition of a solvent, such as hexane or xylene. The solvent reduces viscosity by breaking the polymer chains (e.g., silicone chains) of the phosphor-containing material, causing the phosphor particles to drop out. The solvent is subsequently removed, for example, via evaporation prior to curing of the phosphor-containing material. The polymer chains become re-established upon removal of the solvent.

In some embodiments, cured material above the densely packed layer of phosphor particles that is devoid of phosphor particles may be removed to decrease the thickness of the coating on the chip.

According to some embodiments of the present invention, a stencil may be configured to apply a coating to a plurality of chips. The stencil is positioned such that each one of a plurality of light emitting semiconductor elements disposed on a substrate is located within a corresponding one of a plurality of openings in the stencil. The phosphor-containing material is then deposited in each of the openings and cured, as described above. Also, the phosphor particles may be caused to form a densely packed layer at the one or more light emitting surfaces, as described above.

According to some embodiments of the present invention, a semiconductor light emitting device (e.g., LED chip) has at least one light emitting surface that emits light having a first dominant wavelength upon the application of a voltage to the chip, and a coating of phosphor-containing material (e.g., silicone) on the at least one light emitting surface, wherein the phosphor particles convert light emitted by the light emitting surface to light having a second dominant wavelength different from the first dominant wavelength. The coating is formed by depositing a phosphor-containing material in an opening of a stencil in which the chip is positioned. The material is cured and then the stencil is removed. In some embodiments, phosphor particles in the coating material are arranged in a densely packed layer within the coating at the at least one light emitting surface, and such that the at least one light emitting surface is in contacting relationship with the layer of phosphor particles.

According to other embodiments of the present invention, a method of making a semiconductor light emitting device includes positioning a stencil on a substrate such that a semiconductor light emitting element disposed on the substrate is positioned within an opening in the stencil, and depositing a phosphor-containing material in the opening to form a coating on a light emitting surface of the semiconductor light emitting element. Phosphor particles in the material are caused to become arranged in a densely packed layer within the material at the light emitting surface when the amount of phosphor-containing material is sufficient to convert light to a desired color point. The material is then cured without disturbing the densely packed layer of phosphor particles. In some embodiments, light conversion by the phosphor-containing material is measured substantially in real time as the phosphor-containing material is being applied to the light emitting surface. The phosphor particles are caused to become arranged in a densely packed layer at the light emitting surface by applying a solvent to the phosphor-containing material. The solvent is removed prior to curing. The stencil is then removed from the substrate.

It is noted that aspects of the invention described with respect to one embodiment may be incorporated in a different embodiment although not specifically described relative thereto. That is, all embodiments and/or features of any embodiment can be combined in any way and/or combination. Applicant reserves the right to change any originally filed claim or file any new claim accordingly, including the right to be able to amend any originally filed claim to depend from and/or incorporate any feature of any other claim although not originally claimed in that manner. These and other objects and/or aspects of the present invention are explained in detail below.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

Figure 1:
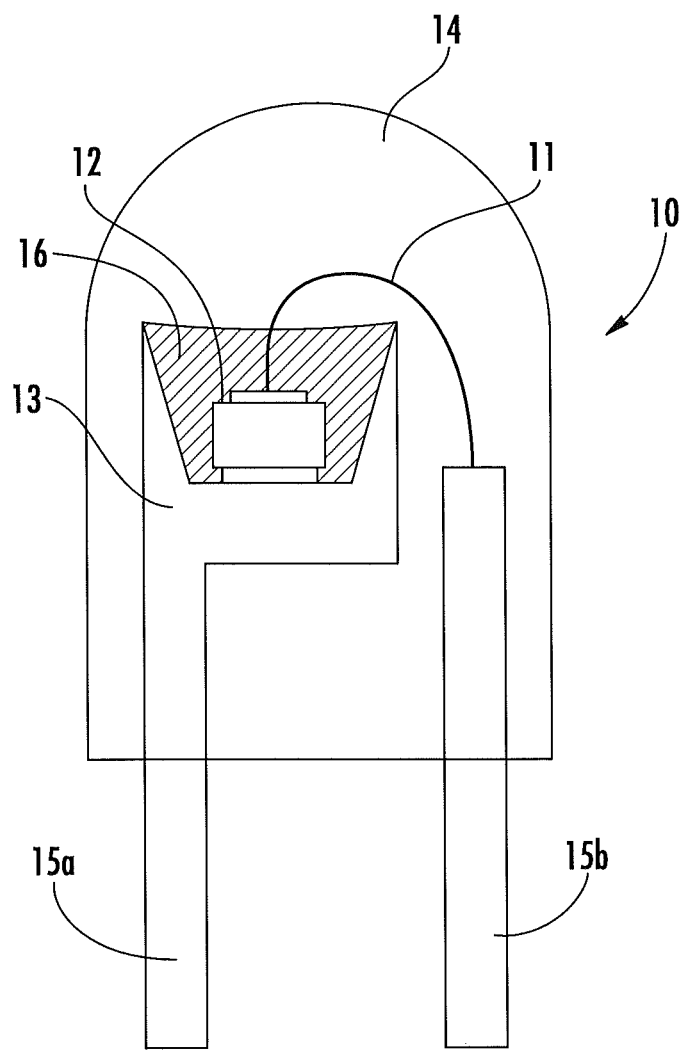
FIG. 1 is a cross-sectional side view illustrating a conventional packaged LED.

The present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. It will be understood that if part of an element, such as a surface, is referred to as "inner," it is farther from the outside of the device than other parts of the element. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The term "densely packed", as used herein means that a first layer or stratum contains a high concentration of phosphor particles and a second layer or stratum above the first layer contains a substantially lower concentration of phosphor particles than the first layer/stratum. The term "densely packed" also refers to any particle packing that has a particle density greater than that which would occur naturally or if the technique applied was not used. For example, if a layer of phosphor particles typically has a thickness of "X", causing the particles to become densely packed in accordance with embodiments of the present invention would result in a thickness of "<X".

Embodiments of the invention are described herein with reference to cross-sectional, perspective, and/or plan view illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Embodiments of the present invention utilize a shaped cavity structure to accurately distribute phosphor based on the emission characteristics of a chip being used. Different shapes can be used to produce different amounts of phosphor applied to different faces/facets of a chip to better balance conversion efficiency.

Figure 2A:
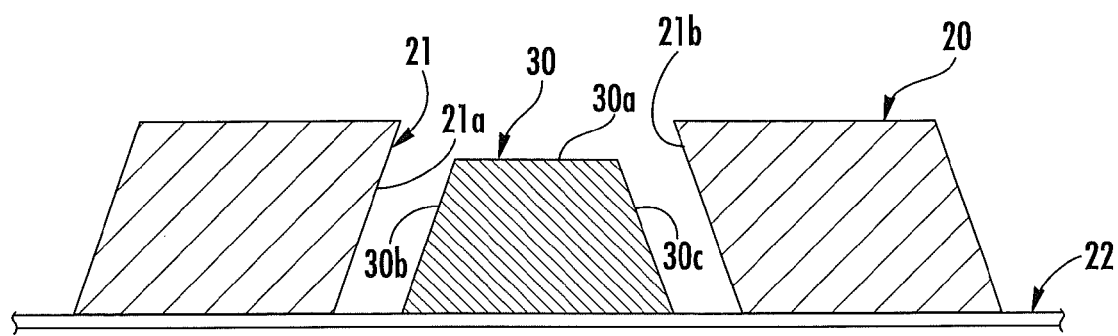
FIG. 2A is a cross sectional view of an LED chip positioned within an opening of a stencil, according to some embodiments of the present invention, and wherein the opening substantially conforms to a shape of the chip.

Referring to FIG. 2A, a stencil 20 is positioned on a substrate 22 such that a semiconductor light emitting element or LED chip 30 disposed on the substrate 22 is positioned within an opening 21 in the stencil 20. In order to maintain the stencil 20 in proper registration with the chip 30, the stencil 20 may be adhesively secured (e.g., via a silicone adhesive) to the substrate 22. Other methods of securing the stencil 20 to the substrate 22 may be used, as well. In addition, the stencil 20 and substrate 22 may be sealed by a barrier material (not shown) to prevent leakage between the stencil 20 and substrate 22 of phosphor-containing material 40 deposited into the opening 21. In some embodiments, an adhesive, such as silicone adhesive, may also serve the function of a barrier material.

In the illustrated embodiment of FIG. 2A, the stencil opening 21 substantially conforms to a shape of the chip, as illustrated. For example, the chip 30 includes an upper light emitting surface 30a and angled, opposed side light emitting surfaces 30b, 30c. The stencil opening 21 includes corresponding, opposed angled walls 21a, 21b, wherein wall 21a is substantially parallel with light emitting surface 30b and wherein wall 21b is substantially parallel with light emitting surface 30c. Although not illustrated, the illustrated chip 30 may also include opposed front and/or rear light emitting surfaces. The stencil opening 21 would also include corresponding opposed walls that conform to the shape of the front and/or rear surface, as would be understood by one skilled in the art.

The LED chip 30 may be a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. In some embodiments, ultraviolet, blue and/or green LEDs may be provided. The design and fabrication of LEDs are well known to those having skill in the art and need not be described in detail herein.

LEDs, according to some embodiments of the present invention, may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 4,966,862 and/or 4,918,497, assigned to the assignee of the present invention, the disclosures of which are incorporated herein by reference in their entirety as if set forth fully herein. Other suitable LED and/or laser structures are described in published United States Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published United States Patent Application Publication No. US 2002/0123164 A1 entitled Light Emitting Diodes Including Modifications for Light Extraction and Manufacturing Methods Therefor, both assigned to the assignee of the present invention, the disclosures of both of which are hereby incorporated herein by reference in their entirety as if set forth fully herein. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention.

In order to facilitate separation of the stencil 20 from the chip 30 without damaging the cured coating or the chip, a mold release material may be applied to the stencil 20 prior to depositing the phosphor-containing material in the opening 21.

Figure 5:
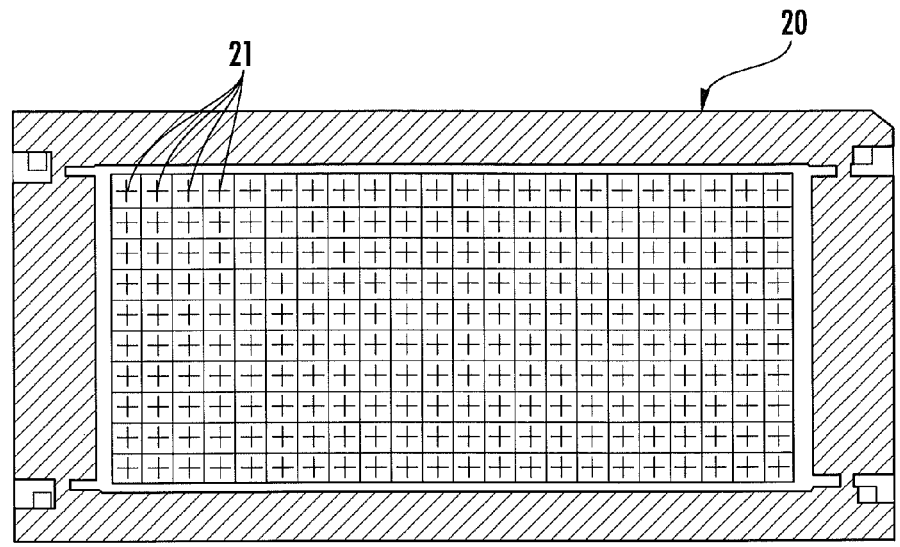
FIG. 5 is a plan view of a stencil having a plurality of openings for receiving a corresponding plurality of LED chips for coating, according to some embodiments of the present invention.

In other embodiments, the stencil 20 may be formed from or coated with a material that facilitates separation of the stencil from the chip. For example, the stencil 20 may be formed of material having a coefficient of thermal expansion that is different from that of the cured phosphor-containing material 40 (FIG. 2B) and/or chip 30. In some embodiments, the stencil 20 may be formed from or coated with material having lower surface energy than that of the cured phosphor-containing material 40, such as polytetrafluoroethylene (e.g., Teflon® brand materials) and parylene. For example, in some embodiments, the stencil 20 is a sheet of polytetrafluoroethylene with one or more openings 21 formed therein. FIG. 5, described below, illustrates a stencil 20 having a plurality of openings 21 formed therein in an array, according to some embodiments of the present invention.

In other embodiments, the stencil 20 may comprise a frame (e.g., metal or other rigid or semi-rigid material) coated with polytetrafluoroethylene, parylene, or another material having lower surface energy than that of the cured phosphor-containing material 40. In other embodiments, the stencil 20 may comprise tape material, such as polyethylene tape.

Figure 2B:
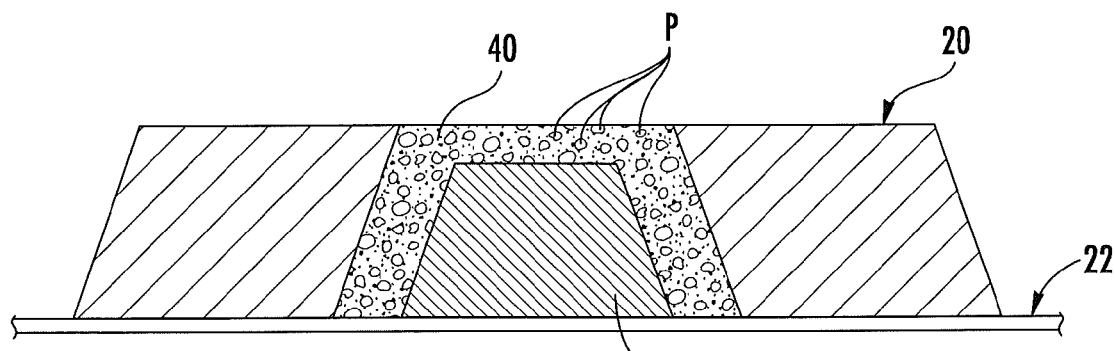
FIG. 2B illustrates phosphor-containing material deposited in the opening of the stencil of FIG. 2A to form a coating on the light emitting surfaces of the chip.

In FIG. 2B, a phosphor-containing material 40 has been injected or otherwise deposited in the stencil opening 21 and substantially fills the opening 21 so as to cover the chip 30 and form a coating 32 on the light emitting surfaces 30a, 30b, 30c, thereof. The phosphor-containing material 40 may be, for example, a transparent epoxy, silicone or other curable polymer. The light emitting surfaces 30a-30c of the chip 30 emit light having a first dominant wavelength upon the application of a voltage to the chip 30. The phosphor particles P in the coating material 40 convert light emitted by the light emitting surfaces 30a-30c to light having a second dominant wavelength different from the first dominant wavelength. As used herein, "light" refers to any radiation, visible and/or invisible (such as ultraviolet) that is emitted by an LED chip. Moreover, as used herein, the term "transparent" means that at least some optical radiation that enters the coating of phosphor-containing material 40 is emitted from the coating of phosphor-containing material 40.

Phosphor particles P utilized in embodiments of the present invention may include Cerium-doped Yttrium Aluminum Garnet (YAG) and/or other conventional phosphors. The phosphor particles P may be mixed into a paste or solution of transparent material comprising silicone using conventional mixing techniques, to thereby provide the phosphor-containing material 40. In some embodiments, the phosphor-containing material 40 may include a binder, such as an epoxy, a silicon-based matrix and/or other solvent. In some embodiments, the phosphor is configured to convert at least some light that is emitted from the light emitting surfaces 30a-30c such that light that emerges from the LED 30 appears as white light. The resulting thickness of the phosphor-containing material 40 on the light emitting surfaces 30a-30c may range between about 2 µm and about 100 µm, in some embodiments of the invention. However, other thicknesses may be used. The thickness that is used may be selected to reduce or minimize self-absorption and/or scattering and may depend on the coating process, the density of the phosphor and/or the desired application.

The amount of phosphor in the coating material 40 and the area covered by the phosphor-containing coating material 40 may be selected to provide a desired light output. The selection may be made in advance or may be tuned when the chip 30 is constructed.

Suitable red phosphors for embodiments of the present invention include, but are not limited to, Sr2Si5N8:Eu2+, and CaAlSiN3:Eu. Other red phosphors that can be used include, but are not limited to, phosphors from the Eu2+—SiAlON family of phosphors, as well as CaSiN2:Ce3+, CaSiN2:Eu2+ and/or phosphors from the (Ca,Si,Ba)SiO4:Eu2+ (BOSE) family. Suitable yellow phosphors include, but are not limited to, Y3Al5O12:Ce3+ (Ce:YAG), CaAlSiN3:Ce3+, and phosphors from the Eu2+-SiAlON-family, and/or the BOSE family. Suitable green phosphors include, but are not limited to, phosphors from the BOSE family, as well as CaSi2O2N2:Eu2+. The phosphor may also be doped at any suitable level to provide a desired wavelength of light output. In some embodiments, Ce and/or Eu may be doped into a phosphor at a dopant concentration in a range of about 0.1% to about 20%. Suitable phosphors are available from numerous suppliers, including Mitsubishi Chemical Corporation, Tokyo, Japan, Leuchtstoffwerk Breitungen GmbH, Breitungen, Germany, and Internatix Company, Fremont, Calif.

Other suitable phosphors that may be utilized according to embodiments of the present invention include nanocrystals (NCs) with a cadmium selenide (CdSe) core surrounded by a zinc sulfide (ZnS) shell that can convert short wavelengths to longer ones. Such crystals can effectively absorb UV-green light and emit green-red light. The absorption and emission spectra of these NCs can be tuned by controlling the diameter of the CdSe core and the thickness of the ZnS shell. Moreover, the NCs have the advantages of high quantum efficiency and photostability. In particular, mixing the NCs with gold nanoparticles induces coupling between CdSe/ZnS NCs and surface plasmons (SPs) on the gold that can enhance the color conversion efficiency.

Figure 2C:
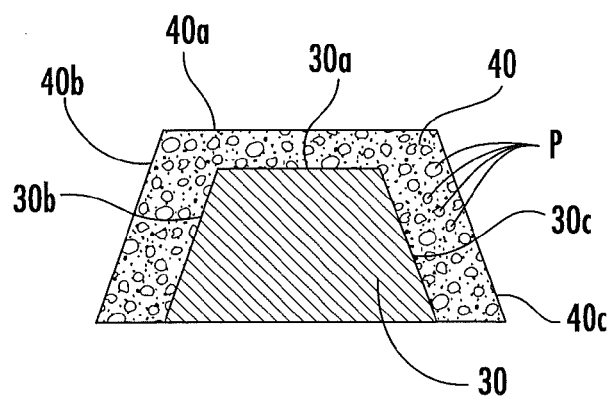
FIG. 2C illustrates the coated chip of FIG. 2B separated from the substrate and the stencil.
Figure 4A:
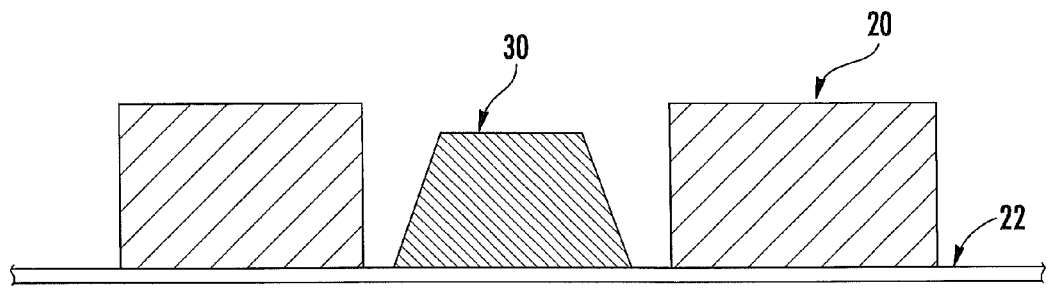
FIG. 4A is a cross sectional view of an LED chip positioned within an opening of a stencil, according to some embodiments of the present invention, and wherein the opening does not conform to a shape of the chip.

In the illustrated embodiment of FIGS. 2B and 2C, phosphor particles P are illustrated in a substantially uniform distribution in the coating material 32. However, as will be described below with respect to FIGS. 4A-4B, the phosphor particles P can be forced to become arranged in a densely packed layer at the light emitting surfaces of the chip 30.

Still referring to FIG. 2B, the phosphor-containing material 40 in the opening 21 is cured and then the stencil 21 is removed. Curing may be performed using conventional methods dictated by the phosphor-containing material's curing schedule. This can include heat curing, optical curing or curing at room temperature. After curing, the stencil is removed from the substrate 22 and the coated chip 30 can be separated from the substrate 22 for subsequent processing, as illustrated in FIG. 2C. The coating of phosphor-containing material 40 substantially conforms to the shape of the chip 30, as illustrated. In other words, each coating layer above a respective light emitting surface has a respective surface that is substantially parallel with the underlying light emitting surface. For example, coating surface 40a is substantially parallel with light emitting surface 30a, coating surface 40b is substantially parallel with light emitting surface 30b, and coating surface 40c is substantially parallel with light emitting surface 30c.

Figure 3A:
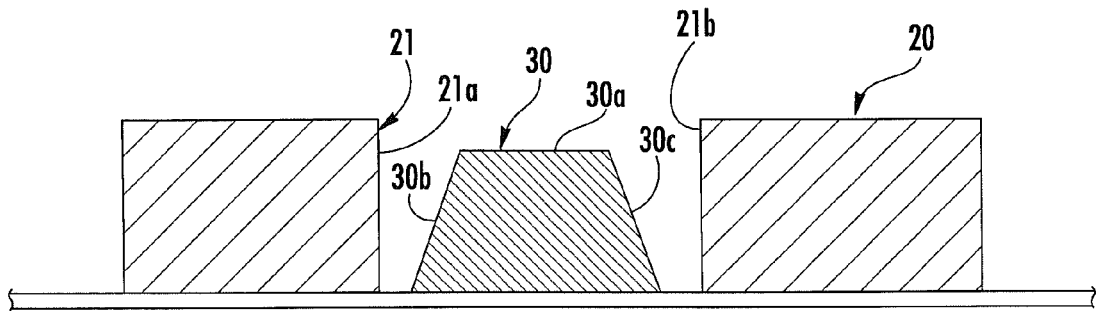
FIG. 3A is a cross sectional view of an LED chip positioned within an opening of a stencil, according to some embodiments of the present invention, and wherein the opening does not conform to a shape of the chip.
Figure 3B:
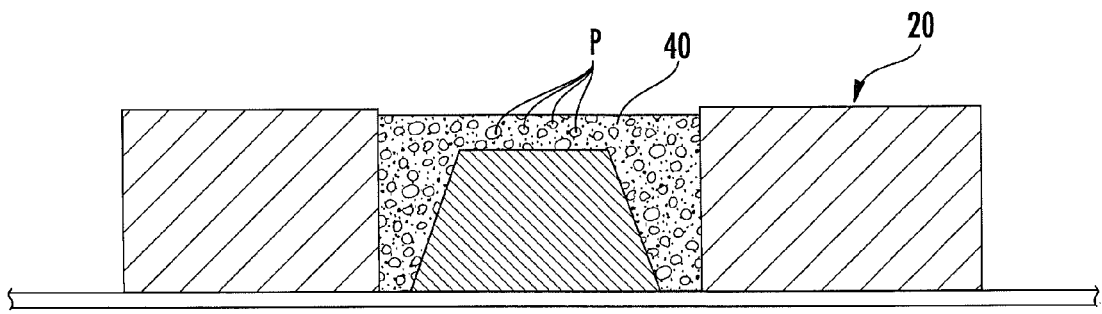
FIG. 3B illustrates phosphor-containing material deposited in the opening of the stencil of FIG. 3A to form a coating on the light emitting surfaces of the chip.
Figure 3C:
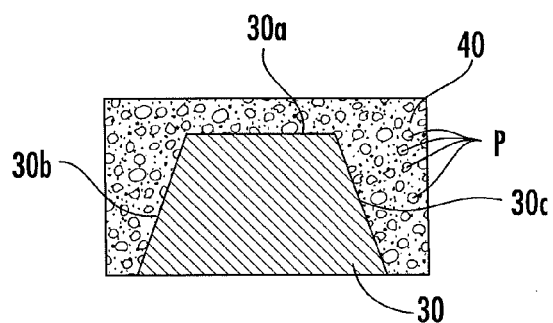
FIG. 3C illustrates the coated chip of FIG. 3B separated from the substrate and the stencil.

Referring to FIGS. 3A-3C, a stencil 20 having an opening 21 that does not conform to a shape of the chip 30 is illustrated. The stencil opening 21 includes substantially vertical opposed walls 21a, 21b instead of angled walls that are substantially parallel with the light emitting surfaces 30b, 30c. The resulting coating of phosphor-containing material 40 on the chip 30 has a generally rectangular shape and does not have the same shape as that of the chip 30, as illustrated in FIG. 3C.

Figure 4B:
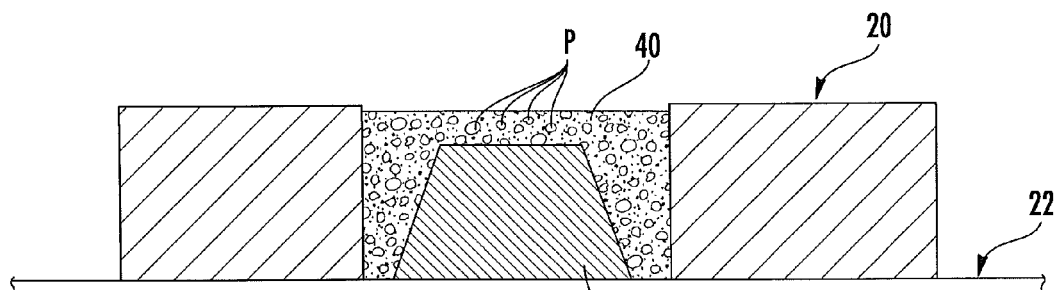
FIG. 4B illustrates phosphor-containing material deposited in the opening of the stencil of FIG. 4A to form a coating on the light emitting surfaces of the chip.
Figure 4C:
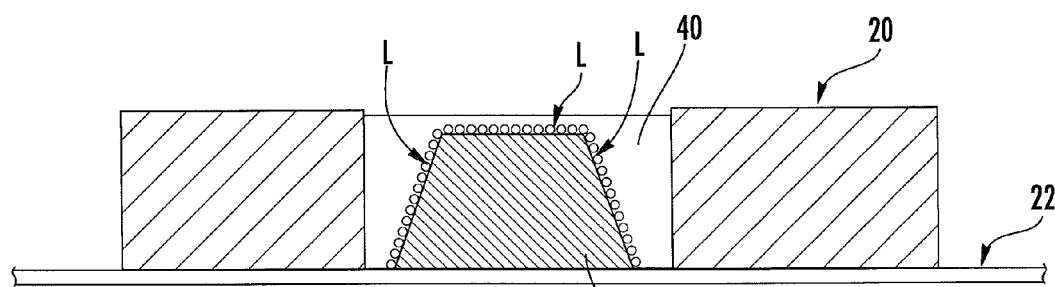
FIG. 4C illustrates the chip of FIG. 4B after phosphor particles in the coating material have become arranged in a densely packed layer at the light emitting surfaces of the chip.
Figure 4D:
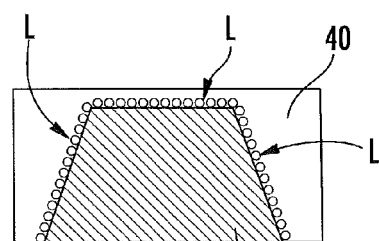
FIG. 4D illustrates the coated chip of FIG. 4C separated from the substrate and the stencil.

Referring now to FIGS. 4A-4D, a chip 30 is positioned within an opening 21 of a stencil 20 (FIG. 4A) and phosphor-containing material 40 is deposited in the stencil opening 21 (FIG. 4B) to form a coating on the light emitting surfaces of the chip, as described above. As illustrated in FIG. 4B, the phosphor particles P are substantially uniformly distributed within the coating material 40. Prior to curing of the phosphor-containing material 40, the phosphor particles P in the coating material 40 are caused to become arranged in a densely packed layer L at the light emitting surfaces of the chip, as illustrated in FIG. 4C. The densely packed layer L of phosphor particles P at each light emitting surface 30a-30c facilitates the transfer of heat from the phosphor particles P to the chip 30. Moreover, the location of each densely packed layer L at a respective light emitting surface 30a-30c decreases the average distance heat generated by the phosphor particles P travels to the chip 30. For example, the average distance that heat generated by the phosphor particles P travels from a densely packed layer L to the chip 30 is substantially less than half the thickness of the coating 40.

Because each densely packed layer L of phosphor particles P is located at a corresponding light emitting surface 30a-30c, coating material 40 above the densely packed layers L of phosphor particles P is devoid of phosphor particles P, and can be removed and/or reduced during subsequent processing of the chip 30, if desired.

The phosphor particles P can be encouraged to become arranged in a densely packed layer L at a chip light emitting surface in various ways. In some embodiments, the chip 30 and phosphor-containing coating material 40 can be subjected to centrifugal force, for example, via a centrifuge. In some embodiments, causing the phosphor particles to become arranged in a densely packed layer at the light emitting surface includes subjecting the phosphor-containing material to at least one harmonic vibration, for example, via a vibration table. In other embodiments, causing the phosphor particles P to become arranged in a densely packed layer L at a light emitting surface includes heating the coating material 40 to a predetermined temperature and for a predetermined time to lower the viscosity of the coating material 40 such that the phosphor particles P can settle at a light emitting surface prior to curing the coating material 40. In other embodiments, causing the phosphor particles P to become arranged in a densely packed layer at the one or more light emitting surfaces comprises applying a solvent, such as hexane or xylene, to the deposited phosphor-containing material prior to curing the material. The solvent reduces viscosity of the liquid material by breaking the polymer chains (e.g., silicone chains) of the phosphor-containing material. This causes the phosphor particles to drop out to the light emitting surface. The solvent is subsequently removed, for example, via evaporation prior to curing of the phosphor-containing material. Upon removal of the solvent, the polymer chains become re-established. Because of the orientation of the various facets of a chip, it may be necessary to rotate or otherwise reposition a chip to effect settling of phosphor particles to a light emitting surface.

Referring to FIG. 5, a stencil 20 for processing a plurality of chips, according to some embodiments of the present invention, is illustrated. The illustrated stencil 20 includes a plurality of openings 21 arranged in an array. The illustrated stencil 20 includes 220 openings, each having rectangular opening dimensions of 1.2 mm×1.2 mm. Each opening is sized such that a 1 mm×1 mm chip can be positioned therewithin. In some embodiments, the thickness of the stencil 20 is typically between about ½H to 2H, where H is the height of the chip being coated. In some embodiments, each opening 21 would be L+50 um to L+1 mm where L is the dimension of the chip being coated (L could be X or Y).

In use, the stencil 20 is positioned such that each one of a plurality of chips disposed on a substrate is located within a corresponding one of a plurality of openings 21 in the stencil 20. A phosphor-containing material 40 can then be deposited in each of the openings 21 and cured, as described above.

When each of the openings 21 in the stencil 2 has the same configuration, use of the stencil 20 results in the thickness of the coating material on each of the chips being substantially the same. As such, a plurality of chips having identical coating configurations can be obtained and the process can be repeated to produce similar chips. In other embodiments, the stencil 20 may include openings 21 having different configurations to change the coating material thickness at different locations of different chips.

Figure 6:
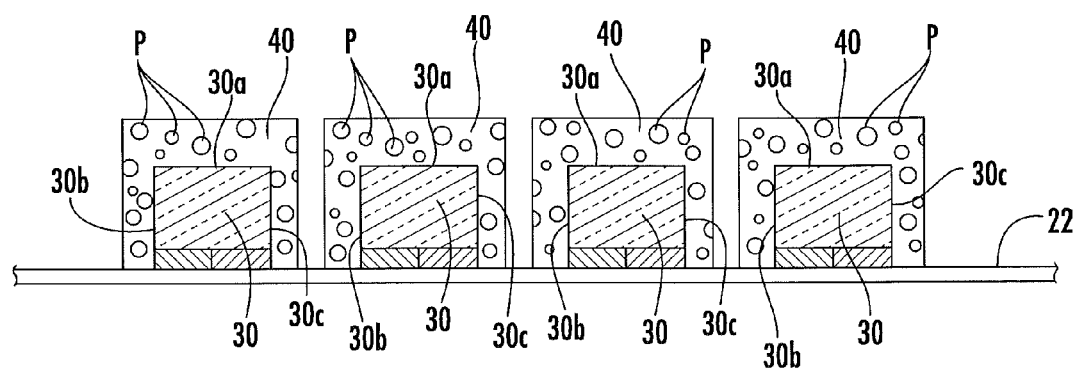
FIG. 6 is a cross-sectional view of a plurality of LED chips on a substrate that have been coated via the stencil of FIG. 5.

FIG. 6 is a cross-sectional view of a plurality of chips on a substrate that have been coated via the stencil of FIG. 5. The illustrated chips 30 each have a cured coating of phosphor-containing material 40 on respective light emitting surfaces 30a-30c. The individual chips 30 can be removed from the substrate 22 and subsequent processing can be performed.

Figure 7:
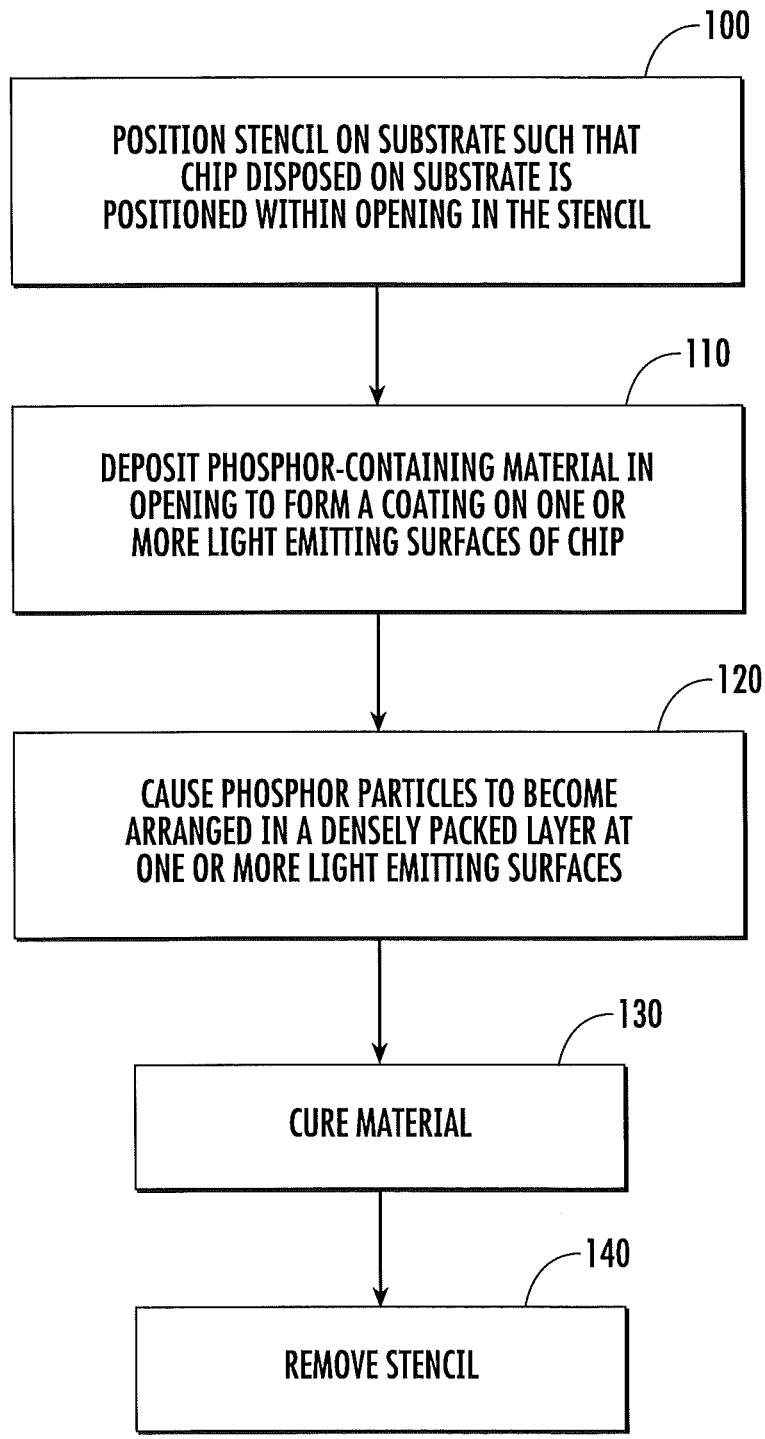
FIGS. 7-9 are flow charts of operations for making semiconductor light emitting devices, according to embodiments of the present invention.
Figure 8:
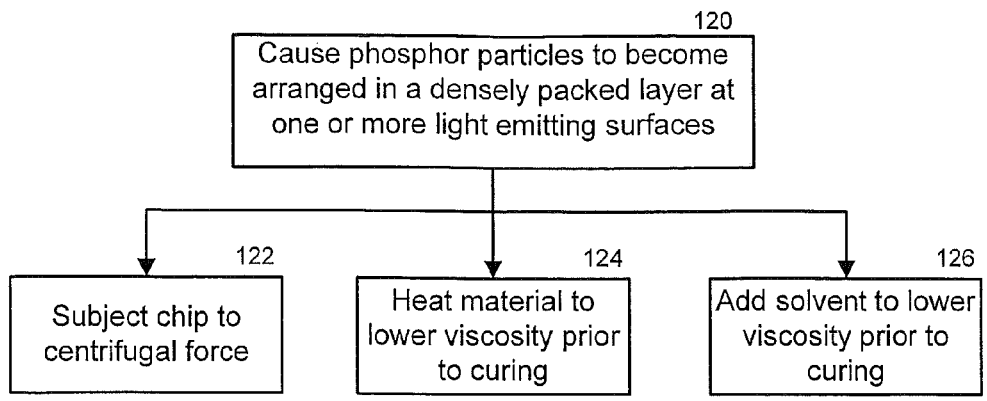

Operations for making semiconductor light emitting elements, according to embodiments of the present invention, are described with reference to FIG. 7. A stencil is positioned on a substrate such that a chip disposed on the substrate is positioned within an opening in the stencil (Block 100). A phosphor-containing material is deposited in the opening to form a coating on one or more light emitting surfaces of the chip (Block 110). In some embodiments, the phosphor particles in the coating material are caused to become arranged in a densely packed layer at one or more of the light emitting surfaces (Block 120). The formation of the densely packed layer may be facilitated by subjecting the light emitting element to centrifugal forces, such as via a centrifuge (Block 122, FIG. 8), by heating the coating material sufficiently to reduce viscosity such that the phosphor particles can settle to the chip surface (Block 124, FIG. 8), and/or by applying a solvent, such as xylene, to the coating material (Block 126, FIG. 8). The coating material is then cured (Block 130). The stencil is the removed (Block 140) and the coated chip can be subjected to further processing operations.

Figure 9:
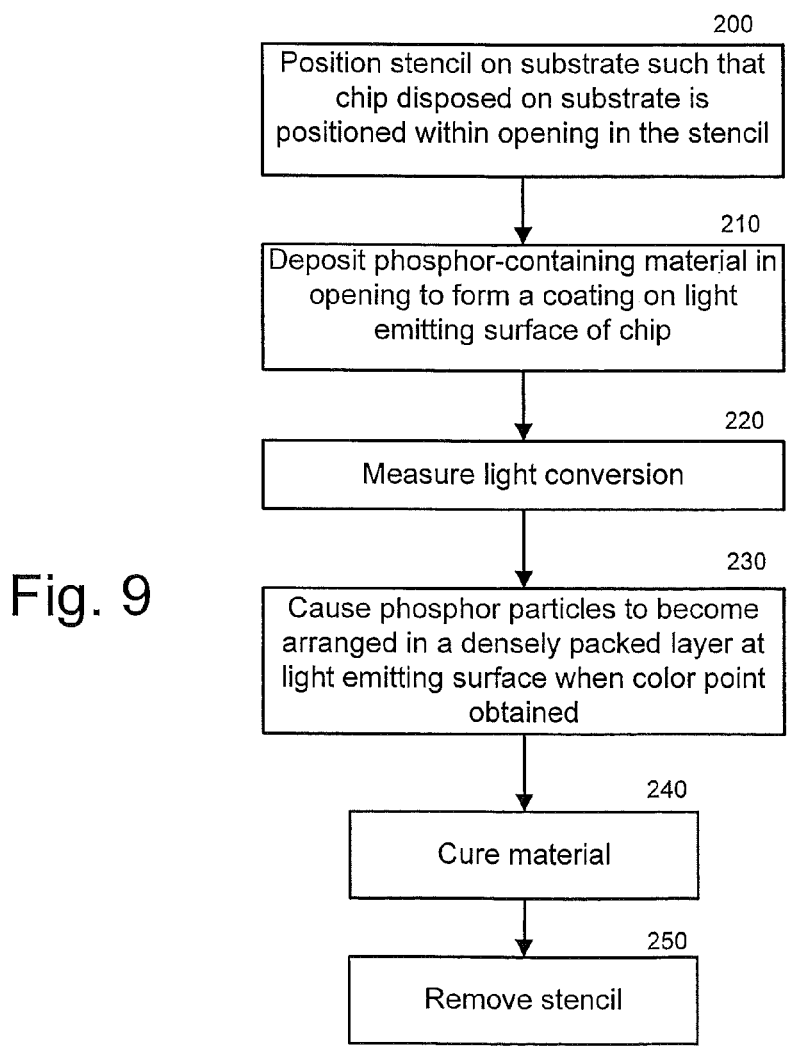

Referring to FIG. 9, operations for making semiconductor light emitting elements, according to other embodiments of the present invention, are described. A stencil is positioned on a substrate such that a chip disposed on the substrate is positioned within an opening in the stencil (Block 200). A phosphor-containing material is deposited in the opening to form a coating on a light emitting surface of the chip (Block 210). The light emitting surface emits light having a first dominant wavelength upon the application of a voltage to the semiconductor light emitting element, and the phosphor particles in the phosphor-containing material convert light emitted by the light emitting surface to light having a second dominant wavelength different from the first dominant wavelength. The amount of light conversion by the phosphor particles in the phosphor-containing material is measured (Block 220). In some embodiments, the amount of light conversion by the phosphor particles in the phosphor-containing material is measured in real time as the phosphor-containing material is applied to the light emitting surface. In other embodiments, an amount is added and then light conversion measurements are taken. This iteration is repeated until a desired color point is reached.

When the amount of phosphor-containing material is sufficient to convert light to a desired color point, no more phosphor-containing material is added to the light emitting surface and the phosphor particles in the material are then caused to become arranged in a densely packed layer within the material at the light emitting surface (Block 230). As described above, this may be effected by heating the phosphor-containing material to lower its viscosity and/or via the addition of a solvent that also lowers the viscosity of the phosphor-containing material. The material is then cured without disturbing the densely packed layer of phosphor particles (Block 240). If a solvent was used to lower viscosity, the solvent is removed, for example, via evaporation, prior to curing. The stencil is the removed (Block 250) and the coated chip can be subjected to further processing operations.

While particular embodiments are described herein, various combinations and sub-combinations of the structures described herein are contemplated and will be apparent to a skilled person having knowledge of this disclosure.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of making a semiconductor light emitting device, comprising:
    positioning a stencil on a substrate such that a semiconductor light emitting element disposed on the substrate is positioned within an opening in the stencil;
    depositing a phosphor-containing material in the opening to form a coating on a light emitting surface of the semiconductor light emitting element, wherein the light emitting surface emits light having a first dominant wavelength upon the application of a voltage to the semiconductor light emitting element, and wherein phosphor particles in the phosphor-containing material convert light emitted by the light emitting surface to light having a second dominant wavelength different from the first dominant wavelength;
    measuring light conversion by the phosphor-containing material as the phosphor-containing material is being deposited in the stencil opening;
    causing phosphor particles in the material to become arranged in a densely packed layer within the material at the light emitting surface, when the amount of phosphor-containing material is sufficient to convert light to a desired color point; and
    curing the material without disturbing the densely packed layer of phosphor particles.

2. The method of claim 1, further comprising measuring light conversion by the phosphor-containing material as the phosphor-containing material is being deposited in the stencil opening.

3. The method of claim 1, wherein causing the phosphor particles to become arranged in a densely packed layer at the light emitting surface comprises applying a solvent to the phosphor-containing material.

4. The method of claim 3, further comprising removing the solvent prior to curing.

5. The method of claim 3, further comprising removing the stencil and the substrate from the semiconductor light emitting element.

* * * * *